(12) United States Patent
Sandberg et al.

(10) Patent No.: US 10,001,690 B2
(45) Date of Patent: Jun. 19, 2018

(54) COLLOID ELECTROLYTE COMPOSITION

(75) Inventors: Mats Sandberg, Norrköping (SE);
Anurak Sawatdee, Vikingstad (SE);
Jessica Ahlin, Norsholm (SE)

(73) Assignee: ACREO SWEDISH ICT AB, Kista (SE)

( * ) Notice: Subject to any disclaimer, the term of this patent is extended or adjusted under 35 U.S.C. 154(b) by 1033 days.

(21) Appl. No.: 14/007,720

(22) PCT Filed: Apr. 5, 2012

(86) PCT No.: PCT/EP2012/056308
§ 371 (c)(1),
(2), (4) Date: Nov. 26, 2013

(87) PCT Pub. No.: WO2012/136781
PCT Pub. Date: Oct. 11, 2012

(65) Prior Publication Data
US 2014/0160549 A1  Jun. 12, 2014

Related U.S. Application Data

(60) Provisional application No. 61/471,827, filed on Apr. 5, 2011.

(30) Foreign Application Priority Data

Apr. 5, 2011  (EP) ...................................... 11161186

(51) Int. Cl.
*G02F 1/155* (2006.01)
*H01M 8/103* (2016.01)
(Continued)

(52) U.S. Cl.
CPC ............ *G02F 1/155* (2013.01); *H01M 6/181* (2013.01); *H01M 8/103* (2013.01);
(Continued)

(58) Field of Classification Search
USPC .......................................................... 524/284
See application file for complete search history.

(56) References Cited

U.S. PATENT DOCUMENTS 4,654,279 A   3/1987  Bauer et al. .................. 429/192
5,284,894 A   2/1994  Wasyliw et al. .............. 524/377
(Continued)

FOREIGN PATENT DOCUMENTS

EP    1 664 167    12/2008
EP    2 169 746     3/2010
(Continued)

OTHER PUBLICATIONS

Cho, J., et al. (2008), "Printable ion-gel gate dielectrics for low-voltage polymer thin-film transistors on plastic", *Nature Materials*, 7: 900-906.
Ollinger, M., et al. (2006), "Laser printing of nanocomposite solid-state electrolyte membranes for li micro-batteries", *Applied Surface Science*, 252: 8212-8216.
International Search Report dated Jun. 22, 2012 issued in PCT/EP2012/056308.
(Continued)

*Primary Examiner* — Ling Siu Choi
*Assistant Examiner* — Thuy-Ai N Nguyen
(74) *Attorney, Agent, or Firm* — Harness, Dickey and Pierce, P.L.C.

(57) ABSTRACT

The invention relates to a colloidal electrolyte composition comprising a polyelectrolyte selected from one or more cationic polymers, a particulate phase forming a colloidal dispersion, and a binder system able to form a cross-linked network upon curing the electrolyte composition. Also, the invention relates to a method of preparation the colloidal electrolyte composition, to an electrochemical cell and to a method of preparation the electrochemical cell.

18 Claims, 2 Drawing Sheets

(51) Int. Cl.
*H01M 8/1044* (2016.01)
*H01M 8/1048* (2016.01)
*H01M 8/1072* (2016.01)
*H05K 3/12* (2006.01)
*H01M 6/18* (2006.01)
*H01M 8/1018* (2016.01)
*H01M 8/1023* (2016.01)
*H01M 8/1051* (2016.01)
*H01M 8/1053* (2016.01)
*H01M 8/1081* (2016.01)
*H01M 10/0565* (2010.01)
*G02F 1/15* (2006.01)
*H05K 1/16* (2006.01)

(52) U.S. Cl.
CPC ....... *H01M 8/1018* (2013.01); *H01M 8/1023* (2013.01); *H01M 8/1044* (2013.01); *H01M 8/1051* (2013.01); *H01M 8/1053* (2013.01); *H01M 8/1081* (2013.01); *H01M 10/0565* (2013.01); *H05K 3/1216* (2013.01); *H05K 3/1275* (2013.01); *G02F 1/1508* (2013.01); *H01M 2300/0082* (2013.01); *H01M 2300/0085* (2013.01); *H05K 1/16* (2013.01); *H05K 2201/10037* (2013.01); *Y02P 70/56* (2015.11)

(56) References Cited

U.S. PATENT DOCUMENTS

| | | | |
|---|---|---|---|
| 6,183,914 B1 * | 2/2001 | Yao | H01M 6/181 |
| | | | 429/309 |
| 6,967,232 B2 * | 11/2005 | Takizawa | H01M 2/1653 |
| | | | 526/286 |
| 2003/0131756 A1 | 7/2003 | Smith et al. | 106/31.27 |
| 2006/0083694 A1 * | 4/2006 | Kodas | B01J 13/0043 |
| | | | 424/46 |
| 2006/0199059 A1 * | 9/2006 | Xu | B01D 69/141 |
| | | | 429/483 |
| 2010/0104915 A1 | 4/2010 | Ino et al. | 429/30 |

FOREIGN PATENT DOCUMENTS

| | | |
|---|---|---|
| WO | WO 1998/042037 | 9/1998 |
| WO | WO 2003/036753 | 5/2003 |
| WO | WO 2008/062149 | 5/2008 |
| WO | WO 2010/118370 | 10/2010 |

OTHER PUBLICATIONS

International Preliminary Report on Patentability dated Jun. 12, 2013 issued in PCT/EP2012/056308.

* cited by examiner

Fig. 4

COLLOID ELECTROLYTE COMPOSITION

PRIORITY STATEMENT

This application is a national stage application under 35 U.S.C. § 371 of PCT International Application No. PCT/EP2012/056308 which has an International filing date of 5 Apr. 2012, and which claims priority under 35 U.S.C. § 119 to U.S. Application No. 61/471,827 filed 5 Apr. 2011 and European Application No. 11161186.9 filed 5 Apr. 2011. The contents of each application recited above are incorporated herein by reference in their entirety.

THE TECHNICAL FIELD

The present invention relates to an electrolyte composition, to a method of producing the composition, to an electrochemical cell comprising the electrolyte composition and to a method of preparation the electrochemical cell.

BACKGROUND ART

The aim with the invention is to provide an electrochemical composition which is printable, and to provide a printable electrochemical device by printing an electrolyte on top of a first electrode, and to print a second electrode on top of the electrolyte. Suitable electrolytes for such an application shall fulfill some requirements, they shall be printable and they shall be over-printable. These properties are in addition to their basic function on having the ability to function as an electrolyte in the device.

It is desirable that the device can be printed on a flexible substrate, for example a porous or fibrous substrate such as paper, and that it can function in a range of environmental conditions without the need for encapsulation. The condition that the device should be printable on fibrous and porous substrates challenge the mobility of the electrolyte at the same time as a minimum mobility is essential for the function of the electrolyte.

The most common group of printable electrolytes consists of either an ionic liquid in a binder system, such as in WO 2008062149 A1, or a salt dissolved in a solvent in a binder system. However, these systems comprise ions that can migrate from the place of print deposition, especially if the substrate is porous, leading to ion depletion in the printed area and contamination of other components. On the other hand, a certain degree of mobility is required for the function of the electrolyte. It is desirable that the electrolyte salt can migrate at least to some extent through the film thickness of the electrode layers between which it is sandwiched.

It has been found that an electrolyte based on polycations provide an acceptable degree of mobility in printed structures, so that ion transport between electrolyte and electrode is sufficient, while migration of the polycations on fibrous substrates is acceptably low. It has also been found that printing polyelectrolytes with screen printing can be problematic due to the amphifilic nature of many polyelectrolytes. As amphiphiles, they can stabilize foams and bubbles. Further, the high molecular weight of the polymer enables formation of bubbles and filaments. In screen printing, where fluid ink meets air and passing a fine mesh, bubble formation is well accommodated. In the ink ink-split moment, when the web is lifted from the substrate, conditions for filament formation are ideal. Filaments and bubbles can lead to poorly defined prints and pin-holes.

It is further desirable that the composition forming the electrolyte has a good printability on a first electrode, as well as the substrate surrounding it, so that a pin-hole free film can be obtained by printing. Further, the so print deposited film should be curable to a film stable enough to be over-printable by a composition forming a second electrode.

Thus, there is a need to destabilize or suppress formation of bubbles or filaments during screen printing of a printable composition based on a quaternized polycation in a crosslinkable binder system.

The most common way to reduce foam and improve leveling in inks involves adding surfactants and silicon based compounds. There are reasons to avoid typical surfactants in an electrochemical cell. The surfactants can form thin insulating layers reducing the ionic connectivity in the cell. It is also known that addition of hydrophobic particles can limit foaming in oil based inks as well as in water-based inks and that hydrophilic particles can stabilize foaming.

Printable electrolytes are previously known. US2006/0199059A1 discloses polyelectrolyte composition which is printable, curable, and contains rigid particles. Herein the curable polymer is conductive as well as the rigid particles.

WO2010/018370 describes an anion exchange polymer obtained by quaternization of tertiary amines by poly(vinylbenzyl chloride). The polymer is deposited and cured on electrodes by printing, also together with solid particles. The quaternised amine is polymerized when curing the composition. The electrodes are to be used in an electrochemical device like a fuel cell.

In WO98/42037 an electrolyte system comprising a blend of polymeric support structures together with electrolyte active species dispersed in the support structure is described. The electrolyte active species are selected from mineral acids or metal hydroxides.

In U.S. Pat. No. 5,284,894 is a low-foaming latex described. Herein is a polyelectrolyte added to a fortified latex to reduce foaming.

A composition comprising a polycationic polyelectrolyte is disclosed in EP 1664167 B1. The composition is included in a process for preparing a humidity sensor by inkjet printing. The disclosed polyelectrolytes have a crosslinkable functional group.

US 2003/0131756 A1 describes an ink composition comprising precipitated complexes of polyquaternary amines and anionic dyes. The composition is suitable for inkjet printing processes.

EP 2169746 describes a catalytic ink in form of a dispersion, and which also comprises polyelectrolytes.

In U.S. Pat. No. 4,654,279 is a solid polymeric electrolyte including two phase electrolyte ink described. One of the phases shows high ionic conductivity and the other phase forms a mechanically strong network and has a slight ionic conductivity. The ionic conducting phase comprises complexed metal salt.

Printable ion gels based on low molecular ionic liquids are disclosed in Cho et al., Nature Materials, 900, 2008, and Ollinger et al, Appl. Surf. Sci., 252, 8212, 2006. These ion gels are suitable for flat substrates.

There are no descriptions of printing processes or printability, or overprintability of compositions forming electrolytes in the aforementioned publications.

Therefore, there is a need for an electrolyte composition comprising polymeric polyelectrolytes which are printable. Especially, the electrolyte composition shall be suitable to be printed upon an electrode material, to form a vertical electrochemical cell. The electrolyte may be suitable in different printing techniques, such as screen printing, in flat-bed printer or rotary printing.

The electrolyte composition of the invention will upon curing form a layer of electrolyte that cover the area of the underlying electrode, the first electrode, substantially without any interruptions in its structure. The printable electrolyte shall also provide good adhesion to the underlying layers as well as being printable, also when aqueous-based composition being printed onto the electrolyte.

SUMMARY OF THE INVENTION

An object for the present invention is to provide printable and curable electrolyte composition based on concentrated polyelectrolytes, where by 'concentrated' is meant that the concentration of polyelectrolyte in the water included in the compositions exceeds 10%.

The basis of the invention is the finding that a composition comprising a concentrated polyelectrolyte in form of a colloid may give an ink with good printing properties to the extent that filament formation and foaming is suppressed.

An embodiment of the invention is an electrolyte composition forming a colloid comprising
a) polyelectrolyte selected from one or more cationic polymers comprising quaternised nitrogen atoms;
b) a solid particulate phase of particles having a median size of between 10 nm to 10 μm;
c) a binder system comprising binder molecules;
d) optionally, a plasticizer;
e) optionally, a processing aid agent; and
f) optionally, a surface active agent.

The polyelectrolyte (a) included in the composition provides a composition with ions and ion mobility necessary for the function of the electrochemical cell. The polyelectrolyte may have a degree of mobility limited by the size of the polyelectrolyte molecules and by the network formed by the binder system. The polyelectrolyte shall be substantially absent from groups that are readily polymerizable under conditions of polymerization, especially typically radical polymerizations.

The solid particulate phase (b) forms a colloid in the polyelectrolyte composition. The solid particles are able to destabilize filaments, films and foams, and are also able to prevent the formation of such structures. In addition to destabilize foams and filaments, the solid particulate phase can have other functions such as modifying the optical properties, for example to make the electrolyte layer opaque, or as particles releasing agents in a controlled manner after deposition or solids binding water.

The binder system (c) comprises binder molecules which may form a network upon polymerization encompassing the polyelectrolyte and reduce its mobility in the cured electrolyte. The binder system comprises also an initiator for the polymerization.

A plasticizer (d) is optionally added to the electrolyte composition to provide flexibility to the cured film. In a humid environment, the polyelectrolyte absorbs water molecules that have a plasticizing effect on the contents of the printed and cured composition. In absence of water, and at low humidity the film can become hard and lose its ability to transport ions. A plasticizer can therefore be added to provide flexibility to the film. The plasticizer may be selected from a flexible polyether, a polyol, such as glycerol, polyglycerol or a fluid hyperbranched polyol.

An additional embodiment of the electrolyte composition is an electrolyte composition comprising
a polyelectrolyte in an amount of 15-65% by weight;
a solid particulate phase in an amount of 15-65% by weight;
a binder system comprising a binder molecules in an amount of 5-25% by weight together with one or more initiator(s) in an amount of 0.1-5% by weight;
a processing aid agent in an amount of 5-35% by weight; and
a plasticizer in an amount of 1-30% by weight.

An additional embodiment of the electrolyte composition is wherein the polyelectrolyte comprises quaternized polyamine, having quaternized amino groups in the polymer backbone, such as ionenes, or having pendant quaternized amino groups.

Further embodiment of the invention is where the quaternised polyamine is a copolymer having quaternised vinylimidazolium repeating units, preferably the copolymer comprises 40-99 mole percent quaternised vinylimidazolium repeating units. In an embodiment of the invention the electrolyte composition comprises a quaternised polyamine being a quaternised chitosan, either quaternised at the nitrogen atom connected to the pyranose backbone of the chitosan, or a nitrogen atom located at a side group attached to the polymer backbone.

An additional embodiment of electrolyte composition is wherein the electrolyte composition comprises solid particulate phase in an amount between about 15 and 65% by weight the total amount of the dry electrolyte composition. The particles are present in the polyelectrolyte for avoiding pinholes and foaming when applying it onto the electrode, before its curing.

In another embodiment the solid particles comprises material with water-binding and water-absorbing properties. Examples of such material are hydrogels. The hydrogels may consist of polysaccharides, preferably cross-linked polysaccharides. Water-binding particles, such as hydrogel particles, and ion exchange particles may have the function of binding water to the polyelectrolyte composition to prevent drying of the particle rich electrolyte composition. If drying of the composition occurs in early and premature stage, this may cause operational process problems such as clogging of printing screens and prevent leveling of printed electrolyte compositions. After printing, it is desired to permit the composition to flow so that patterns left by the screen mesh or pin-holes can level out, in a process called leveling, before the film is cured. A too early, premature, drying prevents leveling and leads to an uneven film with pin-holes. Further, adding particles to a white pigment may improve scattering and improve the white-out effect of a white pigment.

An embodiment of the invention is the electrolyte composition wherein the solid particulate phase comprises pigment particles, preferably titaniumdioxide ($TiO_2$) or zink oxide (ZnO) pigment particles. By having pigment present in the electrolyte composition, forming an opaque composition, a possibility to hide parts of the electrode and electrochemical cell is provided which may be an advantage for some applications of electrochemical devices, for example when electrode materials can be printed thereon.

In one embodiment to the invention, a processing aid agent is present, preferably the processing aid agent being a dispersing aid, more preferably the processing aid agent is lactic acid, more preferably DL-lactic acid.

An electrolyte composition for screen printing, for flatbed printing or rotary printing is provided by the present invention.

The electrochemical cell is printable, for example by methods like screen printing and potentially flexographic printing.

By the present invention an electrolyte composition suitable for a vertical electrochemical cell is provided.

An embodiment of the present invention is an electrochemical cell which comprises a substrate, a first electrode; one or more layers of the electrolyte composition are deposited onto the first electrode; and a second electrode; wherein the deposited electrolyte composition is as defined above and then cured. The first electrode may be placed upon a substrate.

An embodiment of the present invention is an electrochemical cell which comprises a substrate, a first electrode; one or more layers of the electrolyte composition are deposited onto the first electrode; and a second electrode; where the electrolyte composition is as defined above and each layer of the electrolyte composition deposited upon the first electrode being cured before applying the second electrode.

The electrochemical cell may be an electrochromic display device, preferably wherein the electrolyte composition comprises a pigment.

To provide printable and irradiation curable printing inks based on concentrated polyelectrolytes producing opaque electrolyte prints, onto which electrode materials can be printed. The basis of the inventions is the finding that formulating a composition from a concentrated polyelectrolyte as a colloid, where the minority phase is titanium oxide particles, produces an ink with good printing properties.

The electrolyte composition may optionally comprise a surface active agent, preferably the surface active agent is selected from lecithin and polysorbates, most preferably the polysorbate Polyoxyethylene (20) sorbitan monolaurate (available as Tween 20).

According to other aspects illustrated herein an embodiment of the invention is a method of preparing the electrolyte composition. This method comprises the steps:
a) dispersing a solid particulate phase in a polyelectrolyte solution, preferably by homogenization, for example by mechanical homogenization or sonication;
b) preparing a solution comprising a binder system comprising binder molecules and initiator molecules;
c) mixing of the polyelectrolyte-particle dispersion of step a) with the binder solution of step b).

Step c) may be performed in any suitable equipment, for example a homogenizer.

Further optional components of the electrolyte composition may be added, also further amount of liquid forming the dispersion.

According to other aspects illustrated herein, an embodiment of the invention is a method of preparation an electrochemical cell comprising the electrolyte composition of the invention.

The method comprises the steps of
a) optionally, providing a substrate;
b) providing a first electrode;
c) providing an electrolyte composition of the invention;
d) applying the electrolyte composition, as described herein, onto the first electrode;
e) curing the electrolyte composition; and
f) applying a second electrode onto the electrolyte provided by step e).

The step e), the curing of the electrolyte composition may be performed by irradiation, for example by ultraviolet irradiation (UV-light), gamma irradiation; or by chemical or thermal treatment.

Step d) and e) may be repeated several times, to obtain multiple layers of the electrolyte upon the first electrode. An advantage achieved by the procedure is that a reduced density of the electrochemical cell and reduced area of pin-holes may be obtained. Also an increased opacity of the electrolyte may be obtained. Further, by printing the electrolyte twice with two thin layers, instead of using one layer with the same thickness as the two layers, an improved curing at the bottom of the printed layer may be obtained which may be an important aspect when curing with UV-light is used. The UV-light is adsorbed in the opaque layer and an improved result may be obtained in thin layers.

Further advantage of the electrolyte composition is that the cured electrolyte composition can serve as printing substrate even for water based printing inks.

BRIEF DESCRIPTION OF THE FIGURES

In FIG. 2a, the layer as in FIG. 1b it is shown, resulting in the test pixel as in FIG. 2b.
FIG. 2c is the test pixel before (white) applying voltage, and in FIG. 2d it is shown after (shadowed) switching the pixel, as described in example 9.

DETAILED DESCRIPTION OF THE INVENTION

One objective of the present invention is to provide printable electrolyte compositions, for example, in vertically printed electrochemical devices. In a vertically printed electrochemical cell, the electrolyte layer is printed on top of an electrode material, and over the electrolyte, another electrode is deposited to form the electrochemical cell. This way of building electrochemical cells puts certain criteria on the printable electrolyte composition.

First, it should be able to produce a stable and pin-hole-free film with good adhesion to the underlying electrode, as well as to the substrate surrounding the electrode. A vertical electrochemical cell is a stratified laminate structure. Structural integrity of the cell requires adhesion between electrodes and electrolyte, as well as between electrode and electrolyte to the substrate.

Further, printing a second electrode (20) over an electrolyte covering the first electrode (10) requires that adhesion is obtained between the electrolyte and the first electrode, otherwise tension when the screen is lifted may cause delamination. Otherwise, the electrochemical cell (1) would be short circuited when the second electrode would be printed on top of the electrolyte, and reach the first electrode through the pin-holes. Poor adhesion can lead to delamination or cracking of the film, which could reduce connectivity of the electrodes or lead to short circuits in the cracks. In addition, it should be possible to print a second electrode on top of the electrolyte. This means that the electrolyte should be stable to the effects of the solvents used in print deposition of the second electrode. Otherwise, the electrolyte layer would swell and wrinkle with poor connectivity of the second electrode as consequence.

Further, the electrolyte components supporting the conductivity must be sufficiently immobilized. Otherwise, they may migrate throughout the structure with device performance degradation, or even malfunction, as a consequence. If the electrolyte itself migrates, the electrolyte may be depleted inside the cell, but it can also lead to contamination in other parts of the device and shall be avoided.

Further, other components in the composition could migrate, leading to openings in the electrolyte layer that may result in ohmic contacts, or short circuits, between the electrodes.

To the extent the electrochemical cell is an electrochromic display device, the electrolyte should preferably be opaque and be able to hide the electrode behind it, from the perspective of the viewer. In essence, this boils down to provide a polyelectrolyte based printable ink, filled with pigment particles. To suit most of the color properties of most electrochromic materials, the pigment should be white.

Compositions comprising polyelectrolytes have been used in printing processes previously. The polyelectrolytes are expected to be sufficiently immobilized not to cause problems with migration. However, electrolytes based on low molecular weight salts, such as ionic liquids, are expected to migrate unless printed in an encapsulated structure, which limits their use. In order to reach a reasonable thickness of the printed electrolyte, at least a few microns, screen printing is suitable. However, when polyelectrolyte solutions are printed, foaming and filament formation often takes place resulting structural defects like pin pinholes, bubbles and other structural defects. The reason behind may be that many polyelectrolyte molecules have hydrophilic ionic groups as well as hydrophobic parts, such as a hydrocarbon polymer backbone, leading to a structure that can stabilize foams. A high molecular weight can also contribute to fiber forming ability which can stabilize filaments. Formation of filaments and foam often take place in printing during the process part where two surfaces wetted by printing ink separate, so called ink-split. In screen printing techniques, there are also several possibilities for phenomenon like foaming as the printing ink is pressed through a fine mesh with plenty of possibilities of the formation of air enclosures.

As for curing the electrolyte print, it is found that that a binder system forming a polymer network upon curing, in reactions in reactions not involving the polycations in the invention, by cross-linking a binder system mixed with one or more cationic polymers provides a viable solution for producing a printable electrolyte.

Further, by the present invention a screen printable, opaque, over printable, irradiation curable ink based on a polycation blended with an irradiation curable binder with a low tendency to form foams and filaments is possible.

The electrolyte composition of the invention comprises the following:
a) polyelectrolyte selected from one or more cationic polymers being quaternized nitrogen containing compounds;
b) a solid particulate phase comprising solid particles;
c) a binder system comprising binder molecules and initiator molecules;
d) optionally, a plasticizer;
e) optionally, a processing aid agent; and
f) optionally, a surface active agent, and forms a colloidal dispersion.

In one embodiment the electrolyte composition is in form of a colloidal dispersion comprising a) polyelectrolyte selected from one or more cationic polymers being quaternized nitrogen containing compounds; preferably compounds selected from quaternized polyamines; more preferably compounds selected from polyamines which comprise quaternized amino groups in the polymer backbone, such as ionenes, or polymeric amines with pendant quaternized amino groups; or copolymer of quaternised vinylimidazolium, preferably the copolymer comprises 40-99 mole percent quaternised vinylimidazolium repeating units; or quaternised chitosan;
most preferably the cationic polymer is selected from poly[(3-methyl-1-vinylimidazolium chloride)-co-(1-vinylpyrrolidone)] or poly(diallyldimethylammonium chloride), or a copolymer thereof; more preferably poly(diallyldimethylammonium chloride), or a copolymer thereof; having a molecular weight (Mw) of lower than 100000, such as of between 10000 and 100000, preferably between 20000 and 75000. For example between 20000 and 50000.
b) a solid particulate phase comprising solid particles; having a diameter of between 10 nm to 10 μm;
preferably selected from titanium metal oxide, zink oxide or plastic material;
c) a binder system comprising binder molecules forming a crosslinked network upon polymerization as well as initiator molecules, where the binder molecules are suitable for irradiation initiated radical polymerization and; selected from mono- or di(meth) acrylic acid ester of homopolymers or copolymers of alkyleneglycol, or mixtures thereof; preferably homo- or copolymers of polyethylene glycol diacrylate, polypropylene glycol diacrylate, polyethylene glycol monoacrylate, polypropylene glycol monoacrylate, or mixtures thereof, and initiator molecules activated by irradiation (i.e. radical initiators); selected from the groups of diaryl- or monoarylketones and phosphine oxides preferably water soluble photoinitiators such as 2-Hydroxy-4'-(2-hydroxyethoxy)-2-methylpropiophenone, and photoinitiators activated by long wavelength light, such as 2,4,6-trimethylbenzoyl diphenyl phosphine oxide; alternatively, the binder system comprises initiator molecules and molecules that can polymerize into cross-linked networks by thiol-ene polymerization where thiols are selected from the group of di-, tri-, or polyfunctional thiols with high boiling point, preferably trimethylolpropane tris(2-mercaptoacetate), trimethylolpropane tris(3-mercaptopropionate), pentaerythritol tetrakis(3-mercaptopropionate), pentaerythritol tetrakis(2-mercaptoacetate), pentaerythritol tetrakis (3-mercaptobutylate), poly(ethylene glycol) dithiol and ethylene glycol bisthioglycolate; and alkene bearing molecules selected from molecules bearing one or more polymerizable group of methacrylate or allyl type, preferably molecules with solubility in water, such as polyethyeleglycol dimetacrylate, polyethyeleglycol metacrylate, polyethyleneglycol diallyl ether, polyethyleneglycol allyl ether, but also 1,3,5-triallyl-1,3,5-triazine-2,4,6(1H,3H,5H)-trione together with radical initiators activated by irradiation; or selected from the groups of diaryl- or monoarylketones and phosphine oxides preferably water soluble photoinitiators such as 2-hydroxy-4'-(2-hydroxyethoxy)-2-methylpropiophenone, and photoinitiators activated by long wavelength light, such as 2,4,6-trimethylbenzoyl diphenyl phosphine oxide or initiator molecules activated by heat, selected from the group of water soluble thermal initiator molecules such as water soluble azo compounds, hydroperoxides and inorganic peroxides preferably 4,4'-azobis(4-cyanovaleric acid), tert-butyl hydroperoxide, and ammonium-, potassium- or sodiumpersulfate, or selected from mono-difunctional allyl ethers or methacrylic acid esters of polyethylene glycols and d) optionally, a plasticizer; preferably selected from polyalkyleneglycols, preferably selected from polyethyleneglycol, polypropyleneglycol, or mixtures thereof; most preferably poly(ethyleneglycol-ran-propyleneglycol); or selected from hyperbranced polyols or polyglycerols (propane-1,2,3-triol);

e) optionally, a processing aid agent, preferably selected from aliphatic carboxylic acids; most preferably 2-hydroxypropionic acid (DL-lactic acid); and f) optionally, a surface active agent, preferably selected from lecithin and polysorbates; most preferably polyoxyethylene (20) sorbitan monolaurate (Tween 20).

In one embodiment the electrolyte composition according to the invention comprises about 5 to 65%, by weight of the electrolyte composition (dry content), preferably about 15 to 65% by weight, most preferably about 30 to 60% by weight, of particulate phase (b).

The Polyelectrolyte (a)

The polyelectrolyte is the 'active material' in the composition. The polyelectrolyte has the property to provide ions and ion mobility sufficient for the composition to function as an electrolyte in an electrochemical cell. The polyelectrolyte provides mobile second ions and the whole composition provides mobility for ions to create electrolytic connectivity between the electrodes sandwiching the electrolyte in an electrochemical device. This means that the ion transporting paths in the electrolyte should be sufficient to provide ion transport for the electrochemical switches in the electrodes.

The polyelectrolyte can be selected amongst polycationic materials, like cationic polymers having quaternised nitrogen atoms, for example quaternized ammonium groups.

Example of polyelectrolyte comprising quaternised nitrogen atoms is poly[(3-methyl-1-vinylimidazolium chloride)-co-(1-vinylpyrrolidone)]. Another example is poly(diallyldimethylammonium chloride) (PDADMC-Cl).

The poly[(3-methyl-1-vinylimidazolium chloride)-co-(1-vinylpyrrolidone)] is available as 'Luviquat Excellence™' which is a solution comprising 40 wt % of poly[(3-methyl-1-vinylimidazolium chloride)-co-(1-vinylpyrrolidone)] in water. The poly[(3-methyl-1-vinylimidazolium chloride)-co-(1-vinylpyrrolidone)] is a copolymer having 95 mole % 3-methyl-1-imidazolium chloride repeating units and 5 mole % vinylpyrrolidone units. The product is available from BASF GmbH.

The poly(diallyldimethylammonium chloride) is typically used as a water solution comprising 35 wt. % poly(diallyldimethylammonium chloride). The polycationic polyelectrolyte is available from Sigma Aldrich.

The polyelectrolyte cationic polymers having quaternised nitrogen atoms may be present in an amount of between 15 and 65% by weight, preferably in an amount of 10 to 25% by weight (dry content), preferably of about 20% by weight (dry content).

The Solid Particulate Phase (b)

The electrolyte composition described herein comprises a solid particulate phase. The solid particulate phase is present for the purpose to provide a cationic polyelectrolyte stable against interruption, pin-holes and cracks.

The solid particulate phase shall be present in an amount of 5 to 65%, by weight, of the electrolyte composition (dry content), for example, in an amount of about 5 to 40% by weight. Preferably, the electrolyte composition comprises the solid particulate phase in an amount of about 15 to 65% by weight, more preferably about 30 to 60% by weight. Examples are between 40 to 60% by weight, another example is between 50 to 55% by weight. Further examples, the electrolyte composition comprises a solid particulate phase in an amount of 5, 10, 15, 20, 25, 30, 35, 40, 45, 50, 55, 60, or 65% by weight.

The size (e.g. the average diameter) of the particles in the solid particulate phase shall be between 1 nm and 10 μm, for example between 0.1 μm and 5 μm, for example particles of about 0.3 μm or about 0.4 μm (average size). The median particle size may be 0.36 μm.

The solid particulate phase may consist of a solid particulate phase comprising solid particles being inert to the other components included in the electrolyte composition of the invention, and substantially not electronical conductive. For example, the solid particulate phase may consist of particulate pigment. The pigment present in the composition may prevent the electrolyte from being transparent so the equipment underneath, such as the electrodes, is concealed. By this a maximum contrast may be obtained for a vertical electrochrome display. Examples of particulate formed pigment are white titanium oxide ($TiO_2$) pigment, Kronos 2300, available from Kronos AS, Norway. Another example is particles of zinc oxide (ZnO). The solid particulate phase may also consist of plastic material, for example of polymethyl methacrylate (PMMA), available as crosslinked plastic particles, Spheromers® from Microbeads AS. Also mixtures of solid particles may be included, thus the solid particulate phase may comprise particles of pigment and particles of plastic material.

The solid particulate phase (b) forms a colloid in the polyelectrolyte composition. The solid particles are able to destabilize filaments, films and foams, and are also able to prevent the formation of such structures. Although the solid particles may provide a mechanical strength to the cross-linking polymer, forming the binder system when it is cured and dried, the particulate phase is not considered primarily as the binder in the electrolyte composition or the cured electrolyte layer. Further, the polycation initself can add strength to the material after the film is dried from water. However, a simple binary mix of the polycation and solid particles is not be considered as immobilized here, even if they would form a solid dry film, since if it would be immersed in water, the polycation would be dissolved and the binary composition would disintegrate. In addition to destabilize foams and filaments, the solid particle can have other functions such as modifying the optical properties, for example to make the electrolyte layer opaque, or as particles releasing agents in a controlled manner after deposition or solids binding water.

The Binder System (c)

With the binder system (c) it is herein meant the binder molecules, i.e. the polymerizable molecules and the initiator molecules for a polymerization reaction. By the polymerization reactions is a network of the binder molecules formed to provide physical integrity of the cured film. The objective of the binder system is not to bind polyelectrolyte molecules chemically, for example covalently, but to reduce their mobility in the binder network formed by the binder molecule.

The electrolyte composition may comprise the binder system in an amount of 5 to 10% by weight (dry content).

The polymeric binder, thus the binder molecule, included in the binder system shall have at least one polymerizable sites, or polymerizable group(s).

Further as the binders are to exist in an electrolyte, they should preferably be able to dissolve and transport ions between the electrodes in the electrochemical device.

The binder system can be a typical 'UV-curing system' based on molecules with polyfunctional and monofunctional acrylates or methacrylates, radical photoinitiators, and, optionally, co-initiators.

Example is monoacrylates. The polymer may also comprise monomers having two or more functional groups, sites for the polymerization. Further examples of such polymers are di- and polyacrylates, preferably polyethyleneglycol diacrylate.

Typically the binder molecules are selected from the following groups of polymers or copolymers: poly(ethyleneglycol) diacrylate, poly(propylene glycol) diacrylates, and poly(ethyleneglycol) monoacrylates, poly(propyleneglycol) monoacrylates, or mixtures thereof. Examples of such binders are polyethyleneglycol diacrylate, Mn 700 (PEG-diacrylate 700).

The binder system can also be based on thiol-ene chemistry, thus molecules having double bonds and thiol groups, and an initiator molecule, for example a radical photoinitiator. Thiol-ene reactions can give a high monomer conversion and a high degree of polymerization even if the curing is carried out in air and the monomer concentration is low.

The binder system consists of molecules able to form a polymeric network, i.e. the binder molecules, after print deposition to provide cohesive and adhesive strength and integrity to the system. The binder system may comprise one or more binder molecules and one or more initiator molecules for forming the polymeric network including the polyelectrolyte and the solid particulate phase. The binder molecules and the binder system may be curable after the initiation by for example ultraviolet radiation, which initiates the cross-linking, networking reaction.

The polyelectrolyte composition of the invention comprises one or more photoinitiators. These are typically added together with the binder system. The photoinitiators have the ability to initiate a polymerization upon irradiation, thus to cure the polyelectrolyte composition.

Further, the photoinitiator is initiated at a specific wave length, by mixing two or more photoinitiators, being initiated at different wave lengths, the range of wave lengths at which the photoinitiator is activated, and the polyelectrolyte cured, may be broadened.

The photoinitiator, one or more, should preferentially be compatible with all materials in the composition. This means that they should function in composition filled with white pigment particles, meaning that they should initiate in light that are transmitted through such particle dispersion. Further, water may be present in the composition, and all components are to some extent soluble in water, therefore a certain distribution of photoinitiator in water is desirable. UV-curing of printed electrolytes being opaque can be challenging, especially for photoinitiators absorbing at short wavelengths. In the case of white pigments, the light is scattered through the material. For good bulk curing, needed to obtain good cohesion and adhesion to the underlying material, one can use a photoinitiator absorbing at long wavelengths that can pass the pigment filled material.

Examples of photoinitiators are Irgacure 2959, (2-Hydroxy-4'-(2-hydroxyethoxy)-2-methylpropiophenone) 98%, purchased from Sigma Aldrich; Esacure ONE™, which is a difunctional-α-hydroxy ketone, available from Lamberti SA. Esacure is a photoinitiator showing high reactivity which may be an advantage when curing the electrolyte. Another example is 2,4,6-trimethylbenzoyl diphenyl phosphine oxide, 'Lucirin TPO', available from BASF.

The polyelectrolyte composition may contain the initiator in an amount of 0.1 to 2% by weight (dry content).

Alternatively, the binder system can contain binder molecules forming a network by so called thiol-ene chemistry. In thiol-ene curing systems, molecules having multiple bonds and molecules having thiol groups forms a network by forming sulfide bonds in a radical reaction as the main reaction path. The molecules taking part in the polymerization reaction, typically have two or more functional groups, double bonds and thiols, respectively. Examples of suitable molecules with double bonds are polyethyeleglycol dimetacrylate, polyethyeleglycol metacrylate, polyethyleneglycol diallyl ether, polyethyleneglycol allyl ether, and 1,3,5-triallyI-1,3,5-triazine-2,4,6(1H,3H,5H)-trione.

Examples of suitable di- and polyfunctional thiols are trimethylolpropane tris(2-mercaptoacetate), trimethylolpropane tris(3-mercaptopropionate), pentaerythritol tetrakis(3-mercaptopropionate), pentaerythritol tetrakis(2-mercaptoacetate), pentaerythritol tetrakis (3-mercaptobutylate), poly (ethylene glycol) dithiol and ethylene glycol bisthioglycolate.

Alternatively, the binder system may comprise one or more binders which are curable upon thermal treatment.

Plasticizer (d)

A plasticizer (d) may optionally be added to the electrolyte composition to provide flexibility to the cured film. A plasticizer is used to maintain and enhance the printing quality as it helps the electrolyte to flow better through the screen mesh and to give a smoother surface layer of the electrolyte. In a humid environment, the polyelectrolyte absorbs water molecules that have a plasticizing effect on the contents of the printed and cured composition. In absence of water, and at low humidity the film can become hard and lose its ability to transport ions. An added plasticizer may provide flexibility to such a film.

The plasticizer may be selected from a flexible polyether, a polyol, such as polyglycerol, or a fluid hyperbranched polyol.

Typically the plasticizer to be included in the polyelectrolyte composition of the invention is a co-polymer comprising polyethylene glycol (PEG) and polypropylene glycol. An example of plasticizer is poly(ethyleneglycol-ran-propyleneglycol), Mn 12000. Other examples of plasticizers are hyperbranched polyols, such as polyalcohols polymerized with 2,2-dimethylol propionic acid, available as Boltorn® P500 or Boltorn® H2004 by Perstorp, or diglycerol or polyglycerol-3 from Solvay Chemical, or triglycerol.

The plasticizer may be partially soluble in the water phase.

The electrolyte composition may comprise plasticizer in an amount of between 3 to 8% by weight (dry content).

Processing Aid Agent (e)

The electrolyte composition of the invention may also comprise one or more processing aid agent to make the composition more stable resistable during its processing, for example during further treatment like elevated temperature. The processing aid agent may make the composition to stand the treatment without disruption or cracking. Typically, the electrolyte composition may endure thermal treatment of up to 140° C. for several minutes. The processing aid agent keeps the surface layer intact during the heat treatment. An example of agents is a dispersing aid which may be optionally added to keep the solid particles dispersed under dry conditions, thus when the water has been evaporated. The particles may be well dispersed in water, but as the film is processed at high temperature and water evaporates, particles can form aggregates which can lead to disintegration of the film unless a dispersing agent with a low volatility is present. Examples of dispersing aids having this purpose are aliphatic carboxylic acids. Preferably, the acid has a low melting point, in combination with a high boiling point. More specifically the processing aid agent may be 2-hydroxypropionic acid, in its DL-form, also denoted DL-lactic acid. This lactic acid has a melting point of −53° C. and boiling point of 122° C., at 12 mm Hg. The dispersing aid may prevent that the solid particles aggregate causing the coating to form cracks.

The electrolyte composition may comprise the processing aid agent in an amount of between 6 to 14% by weight (dry content).

Surface Active Agent

Another optional component of the electrolyte composition is the surface active agent. The surface agent may be present in an amount of 0.1 to 2% by weight (dry content). The surface active agent may be selected from lecithin and polysorbates. Example of polysorbates is polyoxyethylen (20) sorbitan monolaurate (Tween 20).

Dispersing Medium

The electrolyte composition in form of a colloid comprises also a dispersing medium, thus a liquid. Depending on the components included in the polyelectrolyte composition of the invention, the liquid may be selected from water or solvents, or mixture thereof. Typically, the liquid is aqueous liquids, for example water, or water mixed with lower alcohols, for example ethanol.

An additional embodiment of the electrolyte composition is an electrolyte composition comprising (in % by weight (dry content)):
the polyelectrolyte poly[(3-methyl-1-vinylimidazolium chloride)-co-(1-vinylpyrrolidone)] (Luviquat Excellence) in an amount of 15-65% by weight;
a solid particulate phase comprising titanium dioxide, in an amount of 15-65% by weight;
a binder system comprising poly(ethylene glycol) diacrylate (PEG-diacrylate (700)) as binder molecule, in an amount of 5-25% by weight;
the iniator(s) Irgacure and lucerin-TPO in an total amount of 0.1-5% by weight;
2-hydroxypropionic acid (DL-lactic acid) as processing aid agent, more specifically, as dispersing aid, in an amount of 5-35% by weight; and
poly(ethylene glycol-ran-propylene glycol) as a plasticizer in an amount of 1-30% by weight; and with water as dispersing medium.

An additional embodiment of the electrolyte composition is an electrolyte composition comprising (in % by weight (dry content)):
the polyelectrolyte poly[(3-methyl-1-vinylimidazolium chloride)-co-(1-vinylpyrrolidone)] (Luviquat Excellence) in an amount of about about 23% by weight (dry content);
a solid particulate phase comprising titanium dioxide, in an amount of about about 54% by weight;
a binder system comprising poly(ethylene glycol) diacrylate (PEG-diacrylate (700)) as binder molecule, in an amount of about 6% by weight;
the iniator(s) Irgacure and lucerin-TPO in an total amount of about 0.8% by weight;
2-hydroxypropionic acid (DL-lactic acid) as processing aid agent, more specifically, as dispersing aid, in an amount of about 11% by weight; and
poly(ethylene glycol-ran-propylene glycol) as a plasticizer in an amount of about 5% by weight; and with water as dispersing medium.

An additional embodiment of the electrolyte composition is an electrolyte composition comprising (in % by weight (dry content)):
the polyelectrolyte poly(diallyldimethylammonium chloride) (PDADMA-Cl) in an amount of 15-65% by weight;
a solid particulate phase comprising titanium dioxide, in an amount of 15-65% by weight;
a binder system comprising poly(ethylene glycol) diacrylate (PEG-diacrylate (700)) as binder molecule, in an amount of 5-25% by weight;
the iniator(s) Irgacure and lucerin-TPO in an total amount of 0.1-5% by weight;
the processing aid agent, or dispersing aid DL-lactic acid in an amount of 5-35% by weight.
2-hydroxypropionic acid (DL-lactic acid) as processing aid agent, more specifically, as dispersing aid, in an amount of 5-35% by weight; and
poly(ethylene glycol-ran-propylene glycol) as a plasticizer in an amount of 1-30% by weight; and with water as dispersing medium.

An additional embodiment of the electrolyte composition is an electrolyte composition comprising (in % by weight (dry content)):
the polyelectrolyte poly(diallyldimethylammonium chloride) (PDADMA-Cl) in an amount of about 21% by weight;
a solid particulate phase comprising titanium dioxide, in an amount of about 55% by weight;
a binder system comprising poly(ethylene glycol) diacrylate (PEG-diacrylate (700)) as binder molecule, in an amount of about 6% by weight;
the iniator(s) Irgacure and lucerin-TPO in an total amount of about 0.8% by weight;
2-hydroxypropionic acid (DL-lactic acid) as processing aid agent, more specifically, as dispersing aid, in an amount of about 11% by weight; and
poly(ethylene glycol-ran-propylene glycol) as a plasticizer in an amount of about 6% by weight; and with water as dispersing medium.

The Method

The method of preparing the electrolyte composition comprises following steps:
a) providing a solution comprising a polyelectrolyte;
b) dispersing a solid particulate phase in the polyelectrolyte solution provided in step a), for example by using a mechanical treatment in a mechanical homogenizer;
c) providing a binder system wherein the binder molecules are dissolved in a solution, optionally comprising initiator molecules, typically a photoinitiator; and
d) mixing the dispersion of polyelectrolyte and solid particulate phase provided in step b) with the solution of step c) comprising the binder system, and, also other optional components like processing aid agents, plasticizer and surface active agent. The mixing may be a mechanical mixing in, for example, a homogenizer. Also mixing by sonication may be applicable.

Typically, the method of preparing the electrolyte composition comprises following steps:
a) providing a solution comprising polyelectrolyte, preferably an aqueous solution;

b) dispersing a solid particulate phase in the polyelectrolyte solution provided in step a), for example by using a mechanical treatment, such as a mechanical homogenizer;
c) providing a binder system dissolved in a solution comprising binder molecules and photoinitiators; and
d) mixing the dispersion of polyelectrolyte and solid particulate phase provided in step a) with the solution of step b) comprising the binder system, and also the other components. The mixing may be a mechanical mixing in, for example, a homogenizer.

The polyelectrolyte may be present in an amount of 15-65% by weight; the binder system in an amount of 5-25% by weight; one or more photoiniator(s) in an amount of 0.1-5% by weight; processing aid agent in an amount of 5-35% by weight; the plasticizer in an amount of 1-30% by weight.

The electrochemical cell (1) comprising the electrolyte composition comprises the following components:
optionally, a substrate (40);
a first electrode (10);
one or more layers of the electrolyte composition (30) defined herein deposited onto the first electrode; and
a second electrode (20);
wherein each layer of the electrolyte composition being cured before applying the second electrolyte.
The electrochemical cell may be an electrochromic display device, and the electrochemical cell may comprise an electrolyte composition comprising a pigment.

The method for preparing the electrochemical cell (1) comprising the polyelectrolyte composition according to the invention comprises the steps of
a) optionally providing a substrate (40);
b) providing a first electrode (10) upon the substrate;
c) providing an electrolyte composition as defined herein;
d) depositing the electrolyte composition (30) onto the first electrode;
e) curing the electrolyte composition, preferably by irradiation or by chemical or thermal treatment; more preferably by ultraviolet irradiation; and
f) applying a second electrode (20) onto the electrolyte provided by step e).

The layers of electrolyte composition may have a thickness of between 0.5 µm and 50 µm, for example between 1 µm and 30 µm, or between 5 µm and 15 µm. Preferably, the electrolyte composition is deposited with a thickness of about 10 µm.

By the method it is is possible to deposit an even film substantially without pin-holes or cracks. Further, a higher density of the after the curing may be obtained if the electrolyte layer, comprising pigment, is applied as thin layers.

The Substrate

The electrochemical cell may be placed and applied upon a substrate. The substrate in step a) may be selected from substrate of plastic material, of any fibrous material, of textile, or paper. The substrate shall be suitable for the printing method selected.

The Electrode

The electrode may be applied upon the substrate, is herein denoted as the 'first electrode', and upon the electrolyte, herein denoted the 'second electrode'. Examples of printable electrode materials that can be used to build electrochemical cells with the printable electrolyte composition of the invention are Clevios S V3™, a screen printable electrochromic material based on poly(3,4-ethylenedioxythiophene) poly (styrenesulfonate) (PEDOT:PSS) (provided by Heraeus) and a carbon based printable conductor (DuPont 7102, provided by DuPont).

The electrolyte may be printed using a range of printing methods including flexo, screen, offset and gravure printing. Screen printing is particularly preferred.

EXAMPLES

Example 1

Binder Solution

A solution was prepared by dissolving 1 g Irgacure 2959, 0.8 g Lucerin-TPO in 14 g polyethyleneglycol diacrylate 700, all ingredients purchased from Sigma-Aldrich, under heat and absence of light. The solution was cooled to ambient temperature.

Example 2

A Printable Polyelectrolyte Based on poly[(3-methyl-1-vinylimidazolium chloride)-co-(1-vinylpyrrolidone)] (Luviquat Excellence)

120 g titanium dioxide, Kronos 2300, (median particle size 0.36 µm) purchased from Kronos AS, Norway, is dispersed for 20 minutes in 130 g of a 40% aqueous solution of Luviquat Excellence, purchased from BASF GmbH, Germany, with the aid of 28 g deionized water using a Yellow Line Laboratory mixer from ATP Engineering B. V., equipped with a 70 mm rotor-stator high shear inline mixer. The binder solution prepared according to example 1 was added. Subsequently 12 g poly(ethyleneglycol-ran-propyleneglycol), and 24 g of DL-lactic acid, both purchased from Sigma-Aldrich were added. The mixture was homogenized using the inline shearing mixer for 10 minutes.

Example 3

A Printable Polyelectrolyte Based on poly(diallyldimethylammonium chloride), (PDADMA-Cl)

120 g titanium dioxide, Kronos 2300, was dispersed for 20 minutes in 130 g of a 35% aqueous solution PDADMA-Cl, (labeled 'very low molecular weight' Mw<100 000 g/mol), purchased from Sigma-Aldrich using the mixing equipment as described in example 2. The binder solution prepared according to example 1 was added. Subsequently 12 g poly(ethyleneglycol-ran-propyleneglycol) and 24 g DL-lactic acid were added. The mixture was homogenized using the inline shearing mixer for 15 minutes.

Example 4

A Printable Polyelectrolyte Composition with an Amine Synergist 120 g titanium dioxide Kronos 2300 is dispersed for 20 minutes in 130 g of Luviquat Excellence with the aid of 28 g deionized water using the in-line high shear mixer. The binder solution prepared in example 1 was added. Subsequently 12 g poly(ethyleneglycol-ran-propyleneglycol), 24 g lactic acid and 3.5 g of an amine synergist, Sartomer CN 3755, purchased from Sartomer SA were added to inhibit oxygen termination during curing with ultraviolet initation and irradiation. The mixture was homogenized with the inline shearing mixer for 10 minutes.

Example 5

62.1 g of the electrolyte composition described in example 2 is mixed with 1.0 g of pentaerytritol tetrakis(3-mercapto propionate).

Example 6

A Printable Polyelectrolyte Based on poly[(3-methyl-1-vinylimidazolium Chloride)-co-(1-vinylpyrrolidone)] (Luviquat Excellence) and Lecithine.

A binder solution was prepared according to the procedure in example 1, from 6.98 g Irgacure 2959, 4.95 g Lucerin-TPO in 79.81 g polyethyleneglycol diacrylate 700. To this binder solution was added 750.3 g of a 40% aqueous solution of Luviquat Excellence, followed by mixing using a Yellow Line Laboratory mixer from ATP Engineering B. V., equipped with a 70 mm rotor-stator high shear inline mixer. To 82.33 g of the mixture was 6.35 g poly(ethyleneglycol) 400 added. The mixture was homogenized using the inline shearing mixer for 10 minutes.

Example 7

Printing of Electrochromic Test Structures Using the Electrolyte Composition in Example 2.

A first electrode pattern of PEDOT:PSS, Clevios SV-3, purchased from Clevios GmbH, was screen printed on a transparent plastic substrate (40) using a 120-34 mesh web. Subsequently, the electrolyte pattern is printed, using the composition as in Example 2, and cured twice to give a double layer of the electrolyte (30) described in Example 2. The electrolyte pattern is printed with a 120-34 mesh web and UV cured (Aktiprint T28-1 UV dryer with belt speed setting of 30% of maximum speed). The second electrode pattern (20) is printed using 7102, a carbon based conducting ink purchased from DuPont, and thermally cured at 140° C. for three minutes.

Figure 1A:
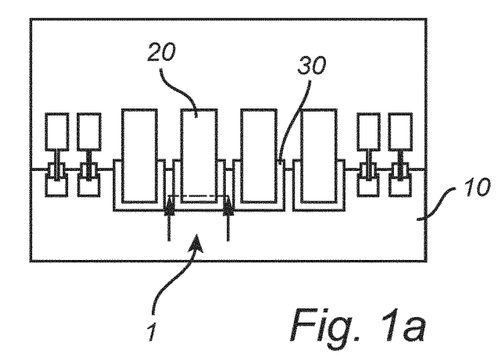
FIG. 1a
Drawing of the electrochromic test-structures (1) printed as described in example 7 below. The first electrode (10), the second electrode (20) and the electrolyte (30), and the substrate (40) is shown in the drawing.
Figure 1B:
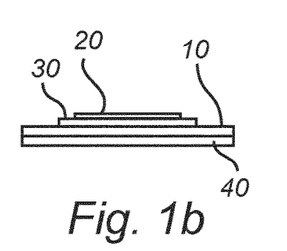
FIG. 1b
In FIG. 1b the electrochemical cell of the electrochromic test-structure is shown in a schematic side view.

A drawing of the electrocromic test-structures printed as described in example 7 is shown in FIG. 1. First, an electrochromic electrode pattern 10 is printed on a transparent plastic substrate. Then the electrolyte layers are printed on areas, for clarity depicted as transparent yellow in the picture. (Due to the white pigment in the compositions they are non-transparent white in reality and as shown in FIG. 2). Finally, the second electrode pattern 20 is printed on top of the electrolyte.

Example 8

Printing of Electrochromic Test Structures Using Electrolyte Ink in Example 3.

The procedure in example 6 is followed except that the electrolyte composition in Example 3 is used.

Example 9

Printing of Electrochromic Test Structures Using Electrolyte Ink in Example 4.

The procedure in example 7 is followed except that the electrolyte composition in example 4 is used.

Example 10

Testing of the Printed Electrochromic Display Pixel in Example 6

A test pixel was cut out from the test-structure printed in example 6. The electrodes were connected to a voltage source so that the electrochromic PEDOT:PSS electrode was connected to the negative pole and the carbon electrode connected to the positive pole. After the voltage is applied, the current is plotted versus elapsed time. The electrochromic PEDOT:PSS pixel turns deep blue as it is reduced during the switch. The voltage used here was 3 V.

Figure 2A:
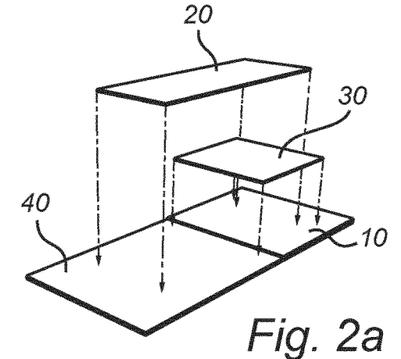
FIGS. 2a, 2b, 2c, and 2d
In FIG. 2a-FIG. 2d a test pixel to be cut out from the test-structure depicted in FIG. 1 is shown.
Figure 2B:
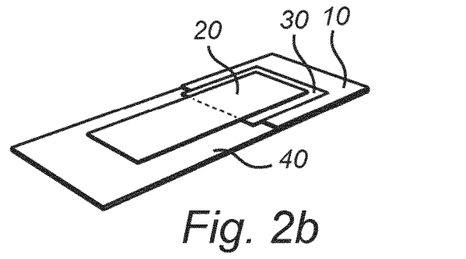
Figure 2C:
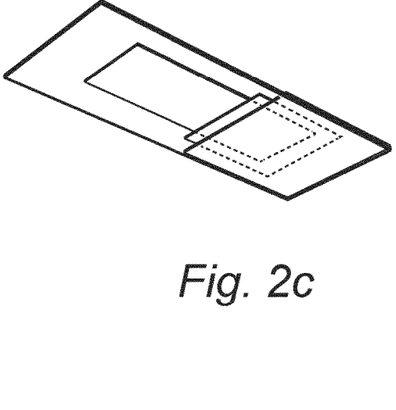
Figure 2D:
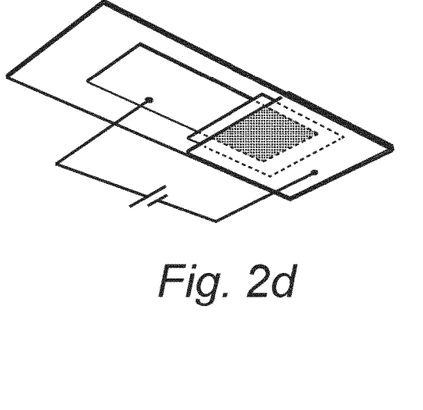

In FIG. 2*a* it is shown a test pixel to be cut out from the test-structure depicted in FIG. 1*a*, and in FIG. 2*c* if is shown before switching (white). In FIG. 2*d*, the pixel can be seen after switching the pixel (shadowed) as described in example 10.

Figure 3:
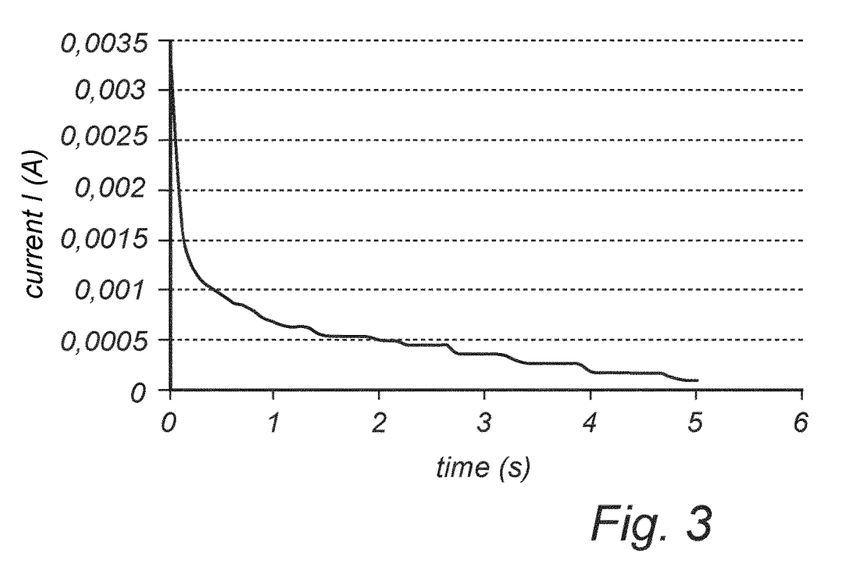
FIG. 3
In FIG. 3 the current flowing through the test pixel versus time after applying the voltage of 3V is shown.

In FIG. 3 the curve obtained when the current flowing through a test pixel is plotted against time after applying 3 V over the electrodes according to example 10. Ocularly, the pixel appears to be switched after circa one second.

Example 11

Testing of the Printed Electrochromic Display Pixel in Example 8.

A test pixel, as an electrochemical cell (1), was cut out from the test-structure printed in example 9 and tested as described in example 10.

Figure 4:
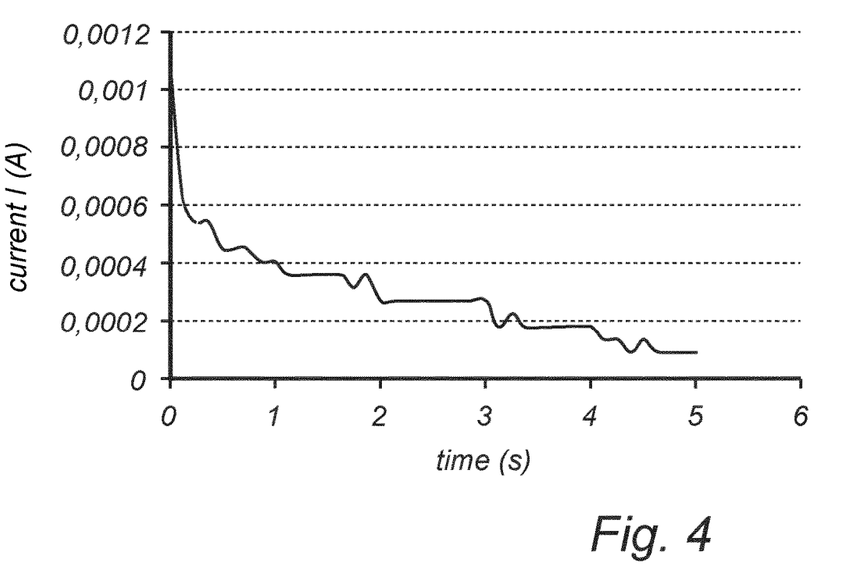
FIG. 4
In FIG. 4 the current flowing through the test pixel versus time after applying the voltage of 3V is shown.

In FIG. 4 the curve obtained when the current flowing through a test pixel is plotted against time after applying 3V over the electrodes according to example 11. Ocularly, the pixel appears to be switched after circa one second.

While the invention has been described with reference to a number of preferred embodiments, it will be understood by those skilled in the art that various changes may be made and equivalents may be substituted for elements thereof without departing from the scope of the invention. In addition, many modifications may be made to adapt a particular form or material to the teachings of the invention without departing from the essential scope thereof. Therefore, it is intended that the invention not be limited to the particular embodiments disclosed for carrying out the invention, but the invention will include all embodiments falling within the scope of the appended claims.

The invention claimed is:
1. An electrolyte composition in form of a colloidal dispersion comprising:
   a) one or more cationic quaternized nitrogen containing polymeric polyelectrolyte(s) selected from the group consisting of (1) a copolymer having quaternized vinylimidazolium repeating units, (2) poly(diallyldimethyl ammonium chloride), and (3) a copolymer thereof;
   b) a particulate phase comprising solid particles having a diameter of between 1 to 10000 nm and being inert to the other components included in the electrolyte composition; and
   c) a binder system comprising binder molecules able to form a polymeric network upon radical polymerization, and initiator molecules able to initiate radical polymerization of the binder molecules, said binder molecules being polyfunctional and monofunctional acrylates or methacrylates, or being di- or polyfunctional thiols and molecules having double bonds;

wherein said polyelectrolyte is substantially absent of groups that are readily polymerizable under conditions of radical polymerization.

2. An electrolyte composition according to claim 1, wherein the polyelectrolyte is poly[(3-methyl-1-vinylimidazolium chloride)-co-(1-vinylpyrrolidone)].

3. An electrolyte composition according to claim 1, wherein the polyelectrolyte is poly(diallyldimethylammonium chloride), or copolymer thereof.

4. An electrolyte composition according to claim 1, wherein the polyelectrolyte has a molecular weight (Mw) of lower than 100000.

5. An electrolyte composition according claim 1, wherein the binder system comprises one or more binder molecules selected from polymerizable substances forming a cross-linked network upon polymerization.

6. An electrolyte composition according to claim 1, wherein the particulate phase comprises pigment particles.

7. An electrolyte composition according to claim 1, further comprising a plasticizer.

8. An electrolyte composition according to claim 7, wherein the plasticizer is selected from polyalkyleneglycolsor selected from hyperbranced polyols or polyglycerols (propane-1,2,3-triol).

9. An electrolyte composition according to claim 1, further comprising a processing aid agent.

10. An electrolyte composition according to claim 9, wherein the processing aid agent is selected from aliphatic carboxylic acids.

11. An electrolyte composition according to claim 1, further comprising a surface active agent.

12. An electrolyte composition according to claim 11, wherein the surface active agent is selected from lecithin and polysorbate(s).

13. An electrolyte composition according to claim 1 comprising (as dry content):
a polyelectrolyte in an amount of 10 to 65% by weight;
a solid particulate phase in an amount of 15-65% by weight;
a binder system comprising a binder molecules in an amount of 5-25% by weight; and one or more initiator(s) in an amount of 0.1-5% by weight;
a processing aid agent in an amount of 5-35% by weight;
a plasticizer in an amount of 1-30% by weight; and
a surface active agent in an amount of 0.1 to 2% by weight.

14. A method of printing, the method comprising applying an electrolyte composition according to claim 1 onto a substrate by screen printing, flat-bed printing or rotary printing.

15. A method of preparing an electrolyte composition according to claim 1, the method comprising:
a) providing a solution comprising polyelectrolyte selected from one or more cationic polymers being quaternized nitrogen containing compounds selected from the group consisting of copolymer having quaternized vinylimidazolium repeating units and poly(diallyldimethyl ammonium chloride) or copolymers thereof, wherein said polyelectrolyte is substantially absent of groups that are readily polymerizable under conditions of radical polymerization;
b) dispersing a particulate phase comprising solid particles having a diameter of between 1 to 10000 nm and being inert to the other components included in the electrolyte composition in the polyelectrolyte solution provided in step a);
c) providing a binder system dissolved in a solution comprising binder molecules able to form a polymeric network upon radical polymerization, and initiator molecules able to initiate radical polymerization of the binder molecules, said binder molecules being polyfunctional and monofunctional acrylates or methacrylates, or being di- or polyfunctional thiols and molecules having double bonds; and
d) mixing the dispersion of polyelectrolyte and solid particulate phase provided in step b) with the solution of step c) comprising the binder system.

16. An electrochemical cell comprising
a substrate;
a first electrode;
one or more layers of an electrolyte composition according to claim 1 applied onto the first electrode;
a second electrode;
each layer of the electrolyte composition being cured before applying the second electrolyte.

17. A method of preparing an electrochemical cell according to claim 16, the method comprising:
a) providing the substrate;
b) providing the first electrode upon the substrate;
c) providing the electrolyte composition;
d) applying the electrolyte composition onto the first electrode;
e) curing the electrolyte composition; and
f) applying the second electrode onto the electrolyte provided by step e).

18. A method of preparing an electrochemical cell according to claim 17, further comprising repeating steps d) and e).

* * * * *